(12) United States Patent
Endoh

(10) Patent No.: US 9,000,488 B2
(45) Date of Patent: Apr. 7, 2015

(54) SEMICONDUCTOR DEVICE

(71) Applicant: Fujitsu Limited, Kawasaki-shi, Kanagawa (JP)

(72) Inventor: Akira Endoh, Machida (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/946,602

(22) Filed: Jul. 19, 2013

(65) Prior Publication Data

US 2014/0061726 A1    Mar. 6, 2014

(30) Foreign Application Priority Data

Sep. 6, 2012   (JP) .................................. 2012-196207

(51) Int. Cl.
| | |
|---|---|
| H01L 29/778 | (2006.01) |
| H01L 29/66 | (2006.01) |
| H01L 29/423 | (2006.01) |
| H01L 29/205 | (2006.01) |

(52) U.S. Cl.
CPC ........ H01L 29/778 (2013.01); H01L 29/66462 (2013.01); H01L 29/7782 (2013.01); H01L 29/7784 (2013.01); H01L 29/42316 (2013.01); H01L 29/205 (2013.01)

(58) Field of Classification Search
USPC .................................. 257/194, 751, 750, 744
See application file for complete search history.

(56) References Cited

U.S. PATENT DOCUMENTS

| | | | | |
|---|---|---|---|---|
| 5,151,757 A | * | 9/1992 | Enoki et al. .................... | 257/194 |
| 5,912,480 A | * | 6/1999 | Zhu et al. ........................ | 257/194 |
| 6,133,593 A | * | 10/2000 | Boos et al. ..................... | 257/194 |
| 6,448,648 B1 | * | 9/2002 | Boos .............................. | 257/751 |
| 6,953,955 B2 | * | 10/2005 | Hsu et al. ....................... | 257/194 |
| 8,076,700 B2 | * | 12/2011 | Magno et al. ................. | 257/200 |
| 8,421,121 B2 | * | 4/2013 | Chou et al. ..................... | 257/194 |
| 2007/0215905 A1 | * | 9/2007 | Kohiro et al. ................. | 257/194 |
| 2007/0278523 A1 | * | 12/2007 | Lin et al. ........................ | 257/194 |
| 2008/0157121 A1 | * | 7/2008 | Ohki ............................... | 257/194 |
| 2013/0099284 A1 | * | 4/2013 | Tserng et al. .................. | 257/194 |
| 2013/0307027 A1 | * | 11/2013 | Lu et al. ......................... | 257/194 |
| 2014/0061726 A1 | * | 3/2014 | Endoh ............................ | 257/194 |
| 2014/0264278 A1 | * | 9/2014 | Bennett et al. ................. | 257/24 |
| 2014/0264379 A1 | * | 9/2014 | Kub et al. ....................... | 257/77 |

FOREIGN PATENT DOCUMENTS

JP        2007-081103          3/2007

* cited by examiner

Primary Examiner — Michael Shingleton
(74) Attorney, Agent, or Firm — Fujitsu Patent Center

(57) ABSTRACT

A semiconductor device includes: an electron transit layer formed with a semiconductor material, the electron transit layer being formed on a semiconductor substrate; an n-type semiconductor layer formed with a semiconductor material having a wider bandgap than the electron transit layer, the n-type semiconductor layer being formed on the electron transit layer; a δ doping area having an n-type impurity doped in a sheet-shaped region, the δ doping area being formed on the n-type semiconductor layer; and a barrier layer formed with a semiconductor material having a wider bandgap than the electron transit layer, the barrier layer being formed on the δ doping area.

18 Claims, 14 Drawing Sheets

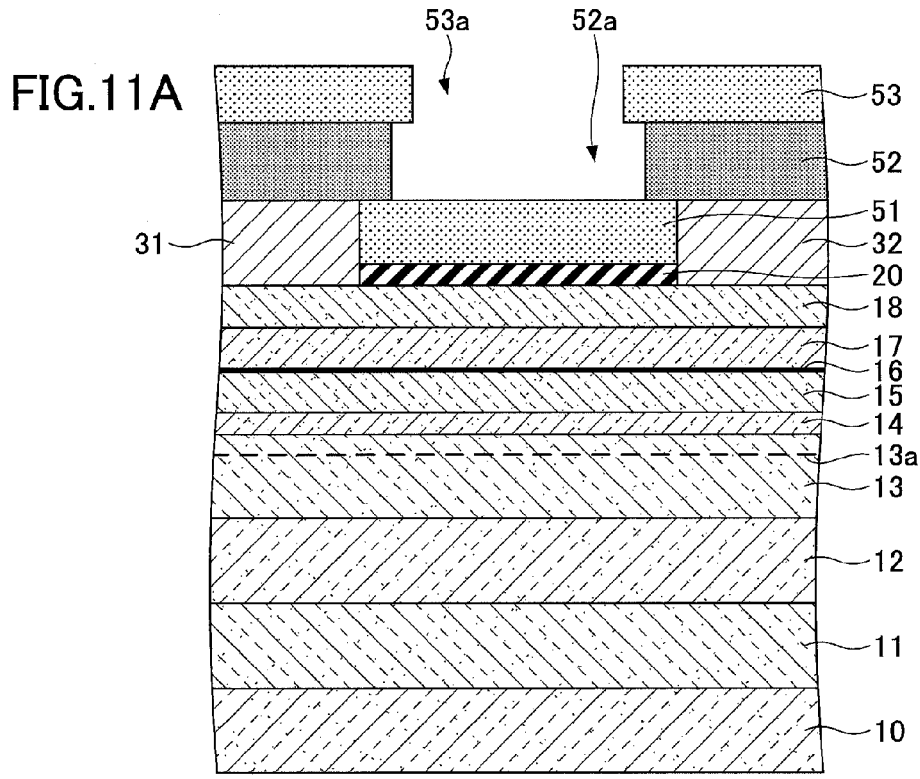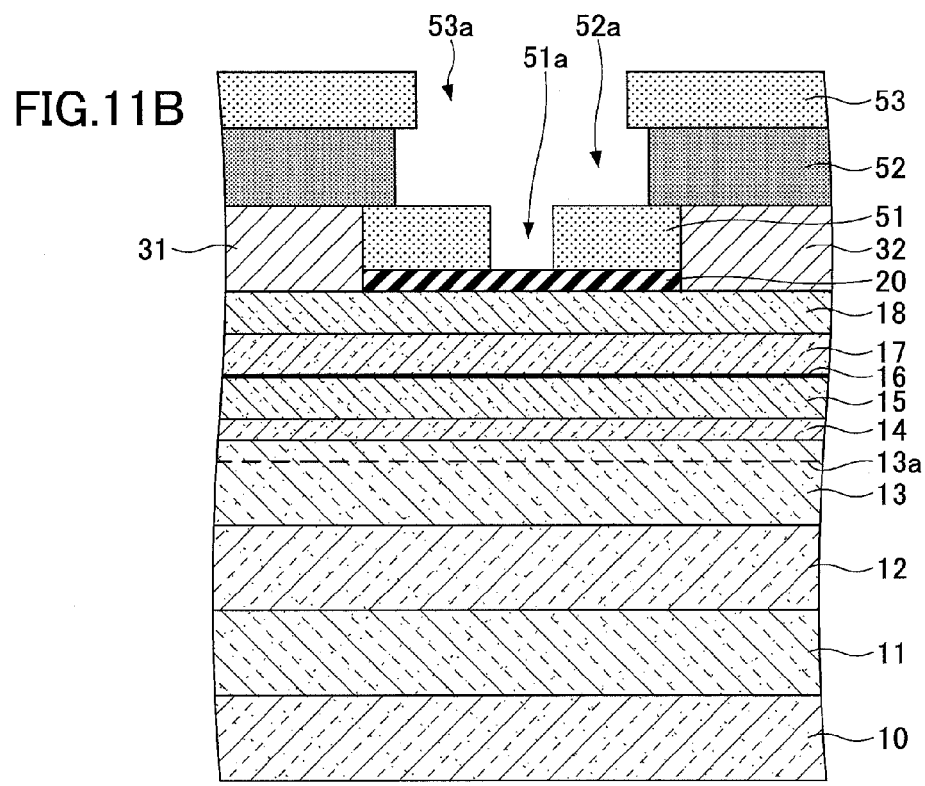

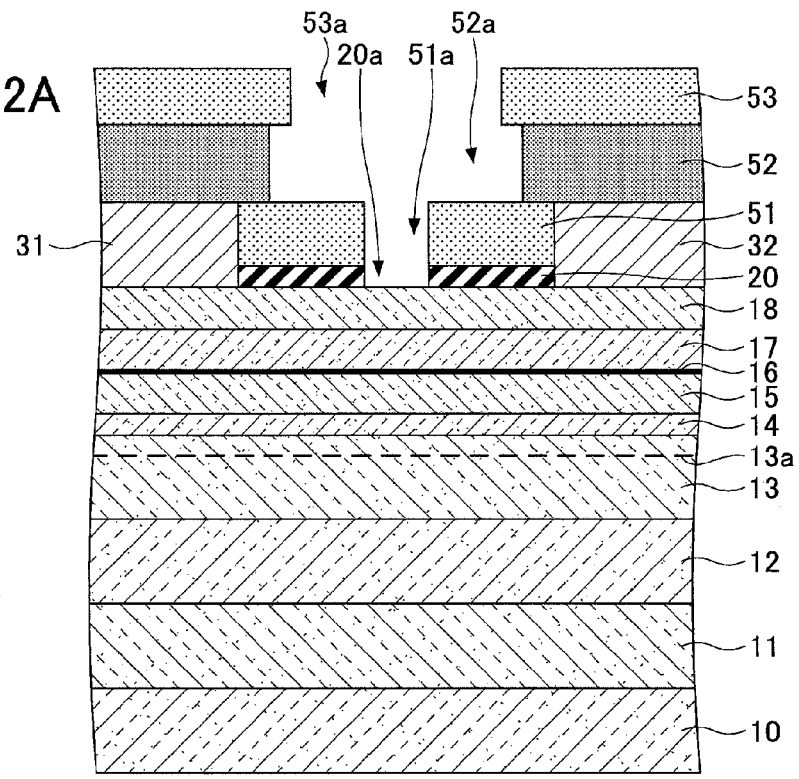
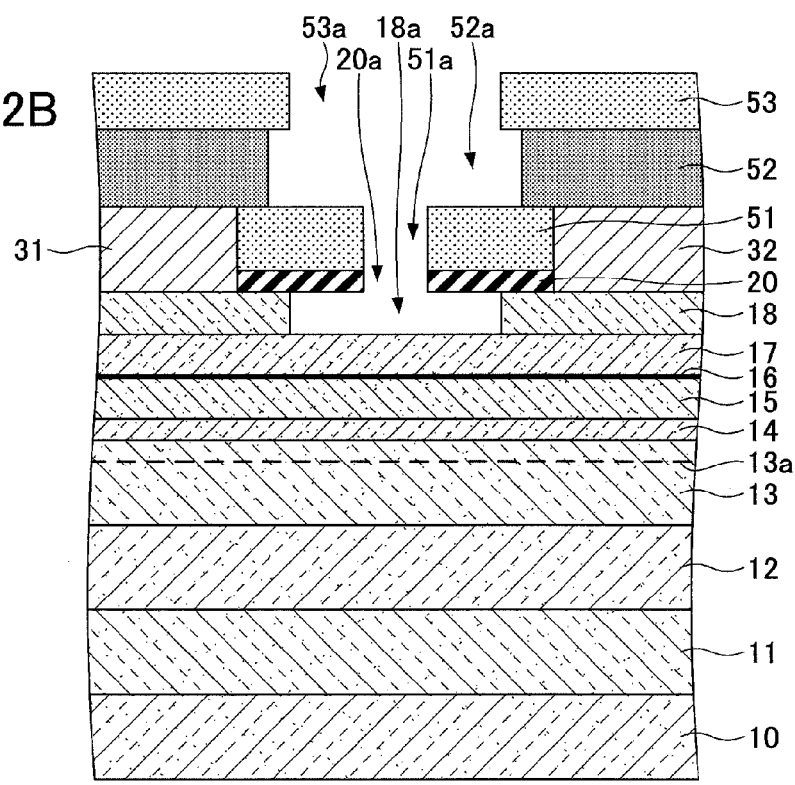

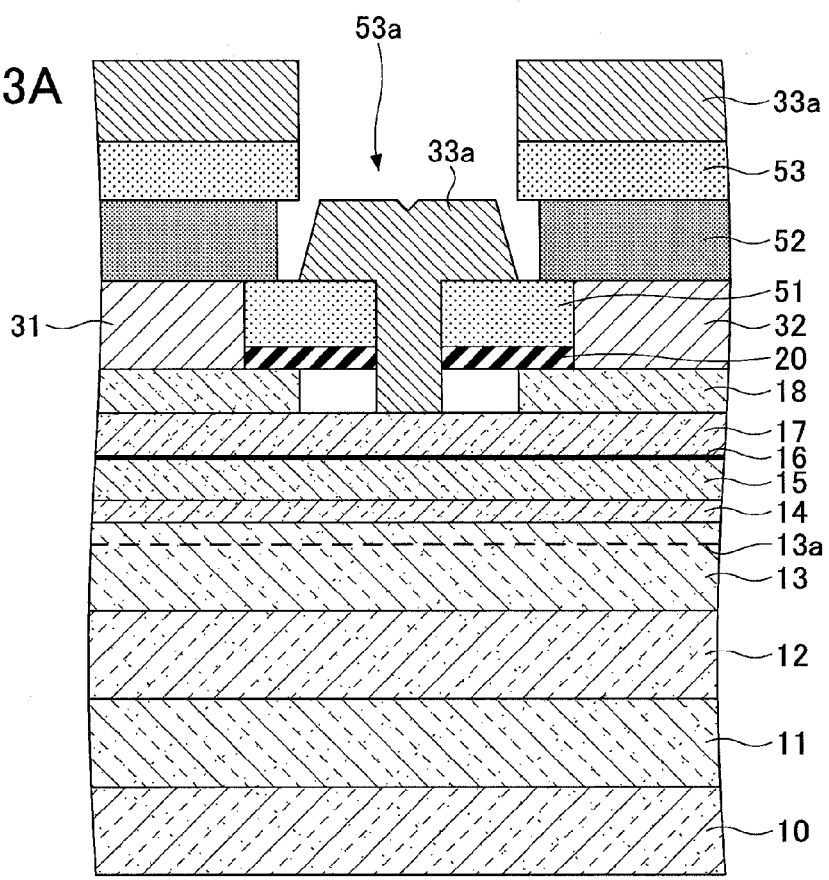
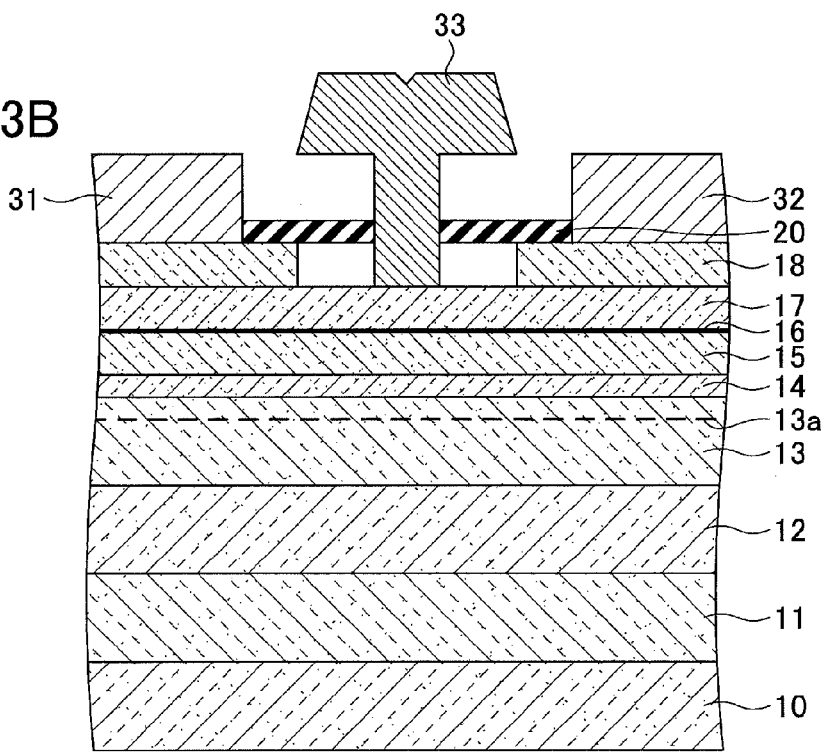

SEMICONDUCTOR DEVICE

CROSS-REFERENCE TO RELATED APPLICATIONS

This application is based upon and claims the benefit of priority of the prior Japanese Priority Application NO. 2012-196207 filed on Sep. 6, 2012, the entire contents of which are hereby incorporated by reference.

FIELD

The disclosures herein relate to a semiconductor device.

BACKGROUND

As high-speed transistors for communications, HEMTs (High Electron Mobility Transistors) are known that include the first generation GaAs HEMTs, the second generation InP HEMTs, followed by Sb HEMTs. In a Sb HEMT, InAs or InSb that has extremely light effective mass of an electron in the Γ valley is used for a channel semiconductor to form an electron transit layer. Here, the effective mass of an electron in the Γ valley is $0.067\ m_e$ for GaAs, $0.043\ m_e$ for $In_{0.53}Ga_{0.47}As$, $0.036\ m_e$ for $In_{0.7}Ga_{0.3}As$, $0.031\ m_e$ for $In_{0.8}Ga_{0.2}As$, $0.022\ m_e$ for InAs, and $0.014\ m_e$ for InSb. Here, $m_e$ is the electron rest mass. By using InAs or InSb for an electron transit layer, the velocity of electrons can be made higher, hence there is a possibility to obtain a HEMT that can operate in a terahertz band.

If using InAs for an electron transit layer, it is often the case that AlSb, AlGaSb or AlAsSb is used for a barrier layer to confine electrons. Also, if using InSb for an electron transit layer, it is often the case that InAlSb is used for a barrier layer to confine electrons. Among these cases, if using InAs with the lattice constant of 0.6058 nm for an electron transit layer, it is comparatively preferable when forming a heterostructure because InAs, AlSb, and GaSb have substantially the same lattice constant of about 0.61 nm.

[Patent Document]
Japanese Laid-open Patent Publication No. 2007-81103

FIG. 1 illustrates a cross-sectional structure of an AlSb/InAs HEMT whose electron transit layer is formed with InAs, and the barrier layer is formed with AlSb. FIG. 2 is a band structure diagram of the HEMT whose structure is illustrated in FIG. 1.

The HEMT with this structure has a semi-insulating GaAs substrate 910, above which graded layers are formed with a buffer layer 911, an i-AlSb barrier layer 912, an i-InAs channel layer 913, an i-AlSb spacer layer 914, a Te-δ doping area 915, an i-AlSb electron barrier layer 916, an i-InAlAs hole barrier layer 917, and an n-InAs cap layer 918. On the n-InAs cap layer 918, a source electrode 931 and a drain electrode 932 are formed, and a gate electrode 933 is formed on the i-InAlAs hole barrier layer 917. Also, except for the area where the gate electrode 933 is formed, the area between the source electrode 931 and the drain electrode 932 on the n-InAs cap layer 918 or the like is covered with a silicon dioxide film 920. Here, in the HEMT with this structure, the i-InAs layer 913 is an electron transit layer.

The AlSb/InAs heterostructure in the HEMT has the so-called "type-II band structure", which is different from a GaAs or InP HEMT in that electrons and holes are spatially separated. Therefore, electrons exist in the i-InAs channel layer 913, and holes that are generated by impact ionization due to small bandgap energy exist in the i-AlSb electron barrier layer 916. Here, two dimensional electron gas (2DEG) 913a is formed in the i-InAs channel layer 913.

In the HEMT with this structure, a leakage current to the gate electrode 933 is suppressed because the i-AlSb spacer layer 914 and the i-AlSb electron barrier layer 916 are barrier layers of electrons. However, the i-InAlAs hole barrier layer 917 is required as a barrier layer for holes because holes exist in i-AlSb electron barrier layer 916. To make the i-InAlAs hole barrier layer 917 work sufficiently as a barrier layer for holes, it is required to be formed with a composition of $In_xAl_{1-x}As$ where x is set to around 0.4 to 0.5. Therefore, the i-InAlAs hole barrier layer 917 is put under a great tensile strain. In addition, it cannot be formed with much thickness, and crystal quality is not so good, which makes it difficult to suppress a leak of holes to the gate electrode 933 completely.

Thus, AlSb/InAs HEMT has a type-II heterostructure that needs to have not only a barrier for electrons but also a barrier for holes to suppress a leakage current to the gate electrode 933. Namely, it is required that both the i-AlSb electron barrier layer 916 or the like and the i-InAlAs hole barrier layer 917 are formed. This makes the total thickness of the barrier layers greater, which in turn makes it difficult to suppress a short-channel effect when refining the gate length $L_g$. Here, to suppress the short-channel effect, a channel aspect ratio $L_g/d$ needs to be kept high as much as possible. Here, d denotes the distance between a gate and a channel.

As a method to suppress a leak of holes to the gate electrode 933 without forming the i-InAlAs hole barrier layer 917, as illustrated in FIG. 3, a method is known in which a Te-δ doping area 915 is formed close to the side where the gate electrode 933 is disposed. FIG. 4 is a band structure diagram of the HEMT that has the structure illustrated in FIG. 3. As illustrated, the band in the i-AlSb spacer layer 914 is bent to work as a barrier for holes. However, in the HEMT with this structure, the position where Te-δ doping area 915 is formed is away from the i-InAs channel layer 913, which makes the density of electrons in the i-InAs channel layer 913 low. Namely, the density of the 2DEG 913a is reduced, resulting in lowered electrical characteristics in the HEMT. Here, in FIG. 3, the structure has an i-InAlAs hole barrier layer 917 formed. In the HEMT with this structure, however, a barrier for holes may be formed without forming the i-InAlAs hole barrier layer 917. Therefore, in the HEMT with this structure, an i-InAlAs hole barrier layer 917 does not need to be formed necessarily, hence it is possible to make the total thickness of barrier layers thinner.

Also, as illustrated in FIG. 5, there is a method of forming a Te-δ doping area 915 and a Te-δ doping area 919 in an i-AlSb spacer layer 914 and an i-AlSb electron barrier layer 916. FIG. 6 is a band structure diagram of the HEMT that has the structure illustrated in FIG. 5. By forming two Te-δ doping areas, it is possible to make the density of electrons higher in the i-InAs channel layer 913. However, the HEMT with this structure cannot confine holes sufficiently for the same reason as with the structure illustrated in FIG. 1.

SUMMARY

According to one embodiment, a semiconductor device includes: an electron transit layer formed with a semiconductor material, the electron transit layer being formed on a semiconductor substrate; an n-type semiconductor layer formed with a semiconductor material having a wider bandgap than the electron transit layer, the n-type semiconductor layer being formed on the electron transit layer; a δ doping area having an n-type impurity doped in a sheet-shaped region, the δ doping area being formed on the n-type semiconductor layer; and a barrier layer formed with a semiconductor material having a wider bandgap than the electron transit layer, the barrier layer being formed on the δ doping area.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 11A-11B are third process charts of a manufacture method of the semiconductor device according to the first embodiment;
FIGS. 12A-12B are fourth process charts of a manufacture method of the semiconductor device according to the first embodiment;
FIGS. 13A-13B are fifth process charts of a manufacture method of the semiconductor device according to the first embodiment.

DESCRIPTION OF EMBODIMENTS

In the following, embodiments of the disclosures will be described. Here, the same members and the like will be assigned with the same numerical codes, and their explanation is omitted.

According to at least one embodiment of the disclosures, it is possible to provide a HEMT without reduced 2DEG density, and with a thinner total thickness of barrier layers.

First Embodiment (Semiconductor Device)

Figure 7:
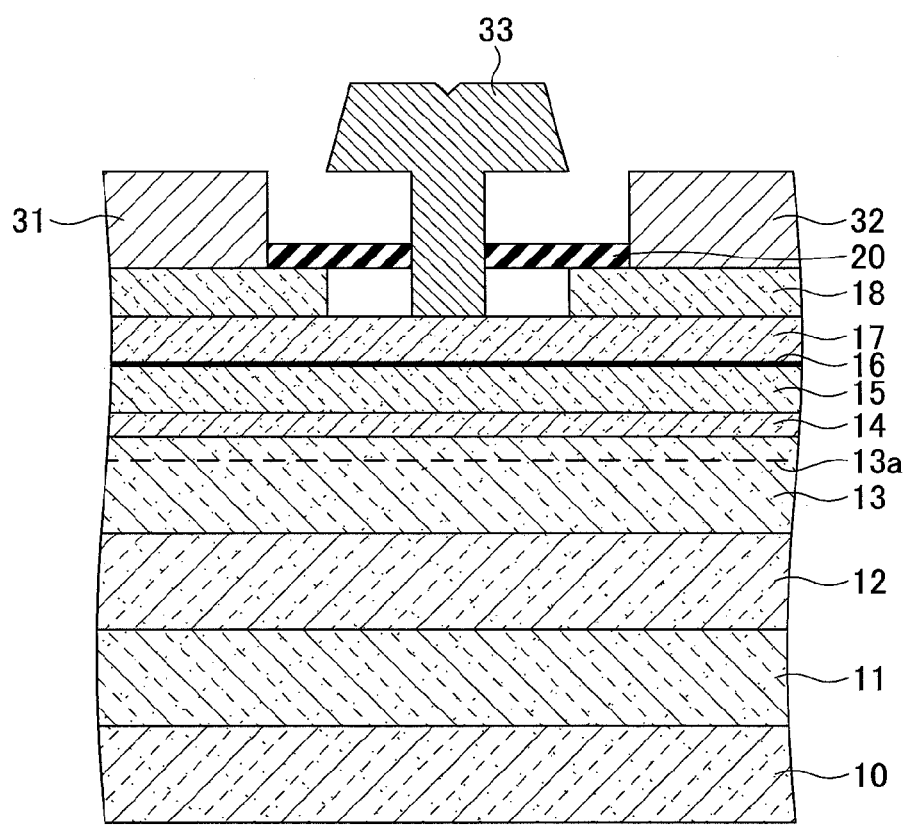
FIG. 7 is a structure diagram of a semiconductor device according to a first embodiment.
Figure 8:
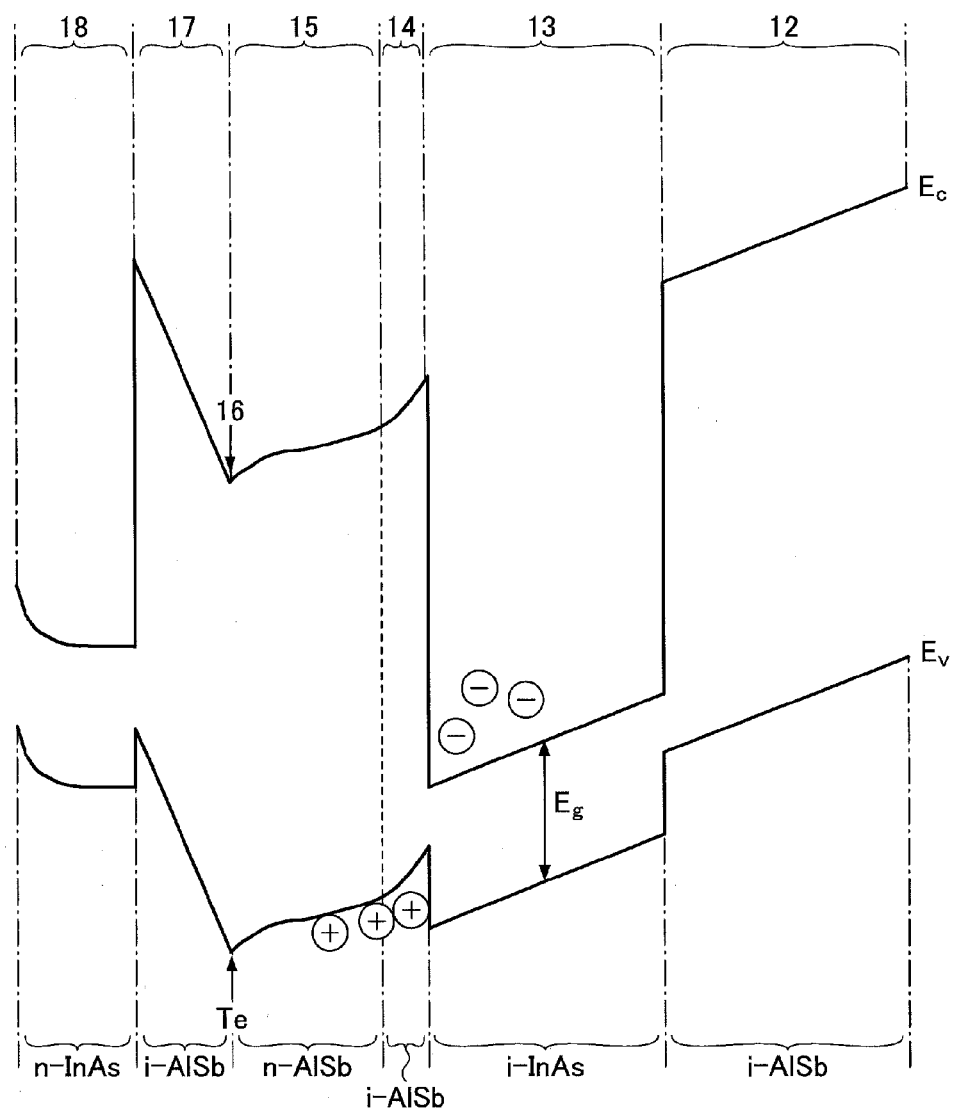
FIG. 8 is a band diagram of a semiconductor device according to the first embodiment.

A semiconductor device will be described according to the first embodiment. FIG. 7 is a structure diagram of a semiconductor device according to the present embodiment. Also, FIG. 8 is a band structure diagram of the semiconductor device illustrated in FIG. 7 according to the present embodiment.

According to the present embodiment, the semiconductor device is an AlSb/InAs HEMT, namely, a HEMT in which an electron transit layer is formed with InAs and a barrier layer is formed with AlSb. This HEMI has a semi-insulating GaAs substrate 10, above which a buffer layer 11, an i-AlSb barrier layer 12, an i-InAs channel layer 13, an i-AlSb spacer layer 14, an n-AlSb layer 15, a Te-δ doping area 16, an i-AlSb barrier layer 17, and an n-InAs cap layer 18 are formed. On the n-InAs cap layer 18, a source electrode 31 and a drain electrode 32 are formed, and a gate electrode 33 is formed on the i-AlSb barrier layer 17. Also, except for the area where the gate electrode 33 is formed, the area between the source electrode 31 and the drain electrode 32 on the n-InAs cap layer 18 is covered by a silicon dioxide film 20. In the present embodiment, there are cases where an i-AlSb barrier layer 12 is described as a lower barrier layer and an i-AlSb barrier layer 17 or the like is described as an upper barrier layer.

In the semiconductor device according to the present embodiment, the i-AlSb barrier layer 12, the i-AlSb spacer layer 14, the n-AlSb layer 15 and the i-AlSb barrier layer 17 are formed with the same semiconductor materials except for the doped impurities. Also, the i-AlSb barrier layer 12, the i-AlSb spacer layer 14, the n-AlSb layer 15 and the i-AlSb barrier layer 17 are formed with a semiconductor material that has a wider bandgap than the i-InAs channel layer 13. Also, n-InAs cap layer 18 is formed with a semiconductor material that has a narrower bandgap than the n-AlSb layer 15, the i-AlSb barrier layer 17 and the like. In the HEMT which is the semiconductor device according to the present embodiment, the i-InAs layer 13 is an electron transit layer.

In the Te-δ doping area 16, Te is doped into a sheet-shaped region. Also, in the n-AlSb layer 15, Te is uniformly doped as an impurity, and in the n-InAs cap layer 18, Si is uniformly doped as an impurity. In a case where Te is doped as an impurity into an AlSb layer, the number of electrons becomes much greater than in a case where Si is doped, hence Te is a preferred impurity to be doped.

In the semiconductor device according to the present embodiment, electrons and holes are spatially separated; electrons exist in the i-InAs channel layer 13, and holes exist in the i-AlSb spacer layer 14 and the n-AlSb layer 15. Consequently, 2DEG 13a is formed in the i-InAs channel layer 13.

Also, according to the present embodiment, the Te-δ doping area 16 is provided, and further, the n-AlSb layer 15 is provided between the i-AlSb spacer layer 14 and the Te-δ doping area 16. Consequently, the Te-δ doping area 16 forms a valley of the valance band, and the valance band in the n-AlSb layer 15 is formed with a gradual descent starting from an area that contacts the i-AlSb spacer layer 14 to an area where Te-δ doping area 16 is formed. Therefore, holes can be confined into the area, which makes it possible to suppress a leak of holes to the gate electrode 33.

Next, it will be described to what extent holes can be held on the side where the i-InAs channel layer 13 is formed in the semiconductor device according to the present embodiment, by comparing with the HEMT illustrated in FIG. 1.

The effective mass of a hole in AlSb is $0.336\,m_e$ for a heavy hole in (100) direction, and $0.123\,m_e$ for a light hole in (100) direction. Here, $m_e$ is the electron rest mass. A quantum level of a hole will be estimated by triangular potential approximation, and a case will be considered in which holes generated by impact ionization enter into levels starting with a low-energy level.

Figure 1:
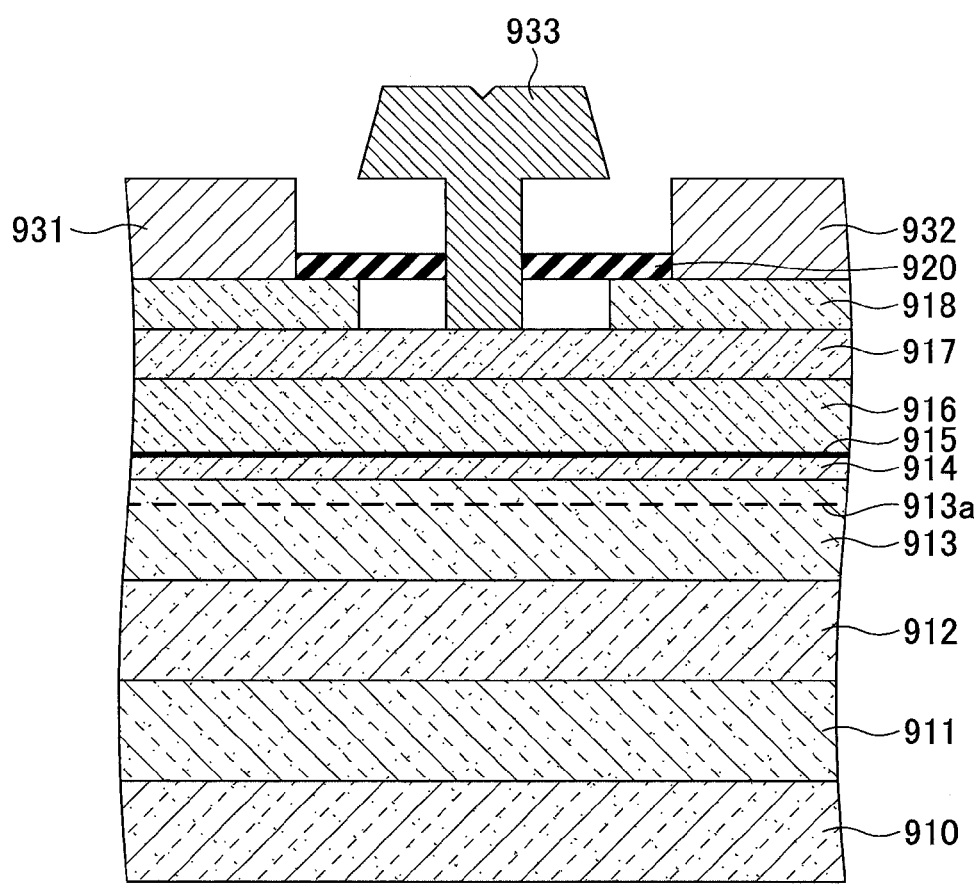
FIG. 1 is a first structure diagram of an AlSb/InAs HEMT.
Figure 2:
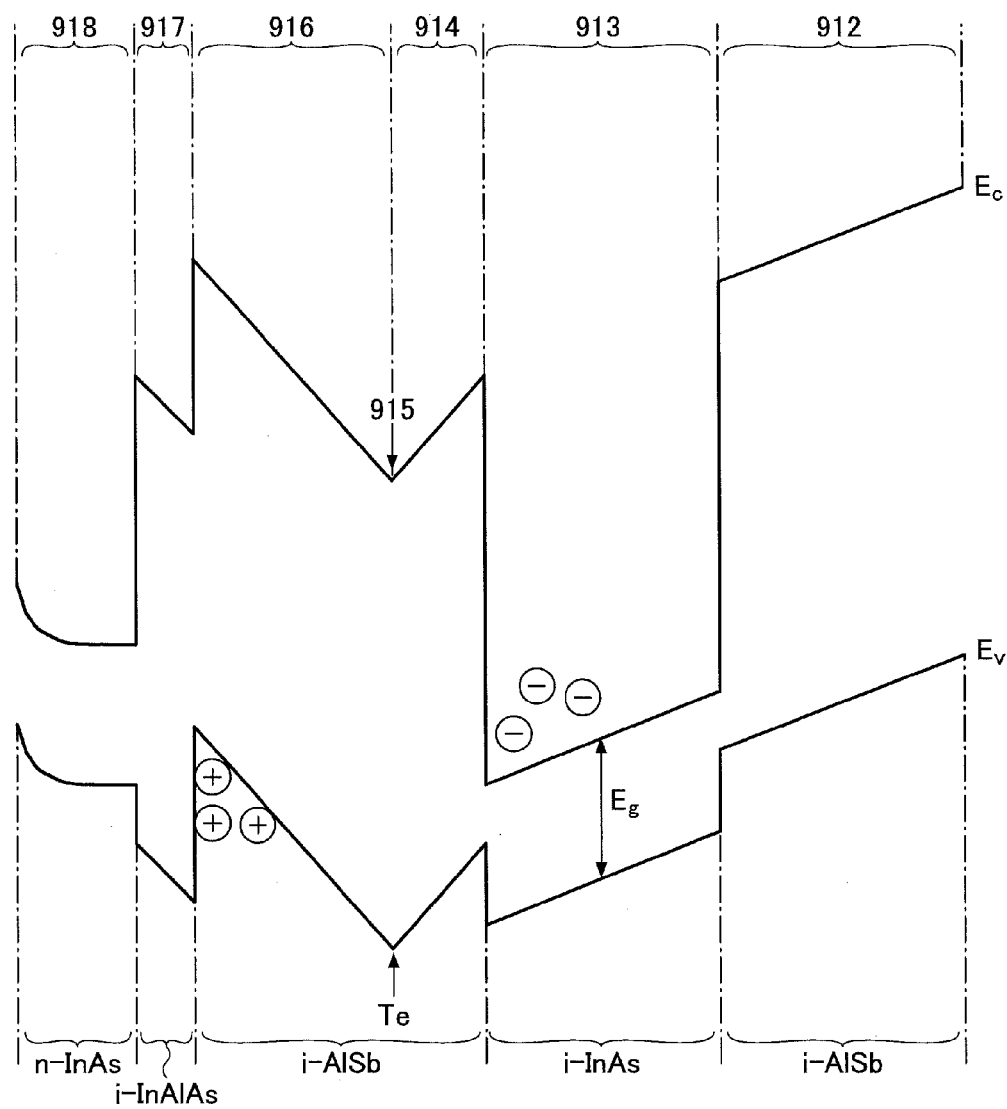
FIG. 2 is a first band diagram of an AlSb/InAs HEMT.
Figure 3:
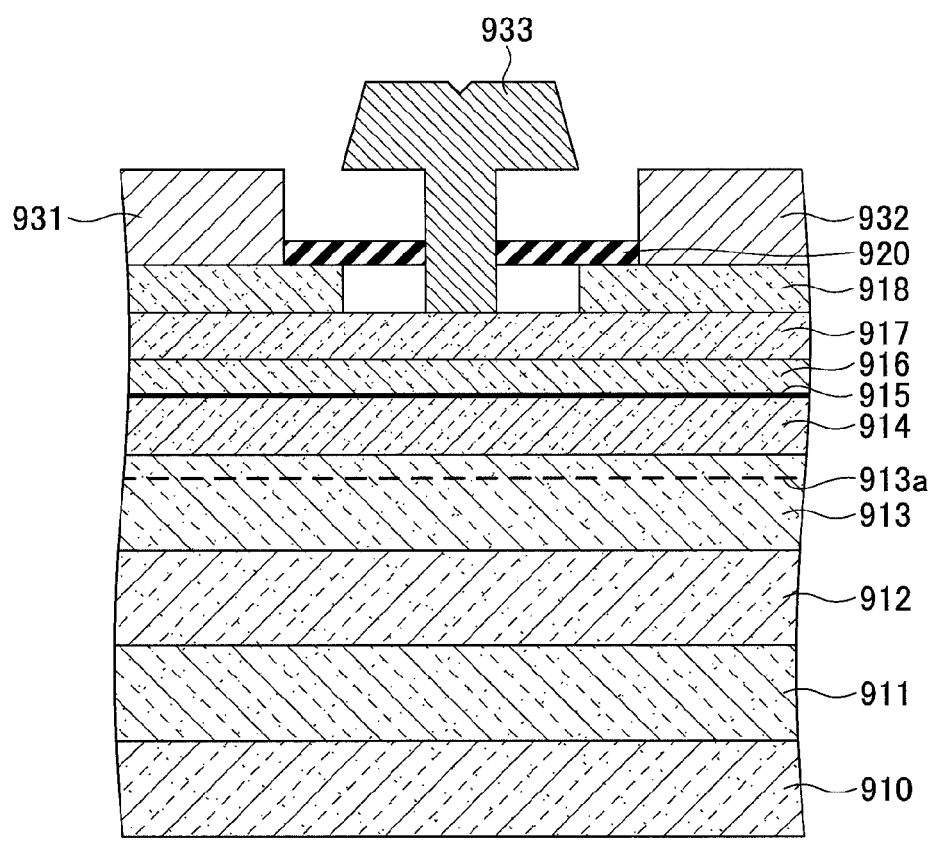
FIG. 3 is a second structure diagram of an AlSb/InAs HEMT.
Figure 4:
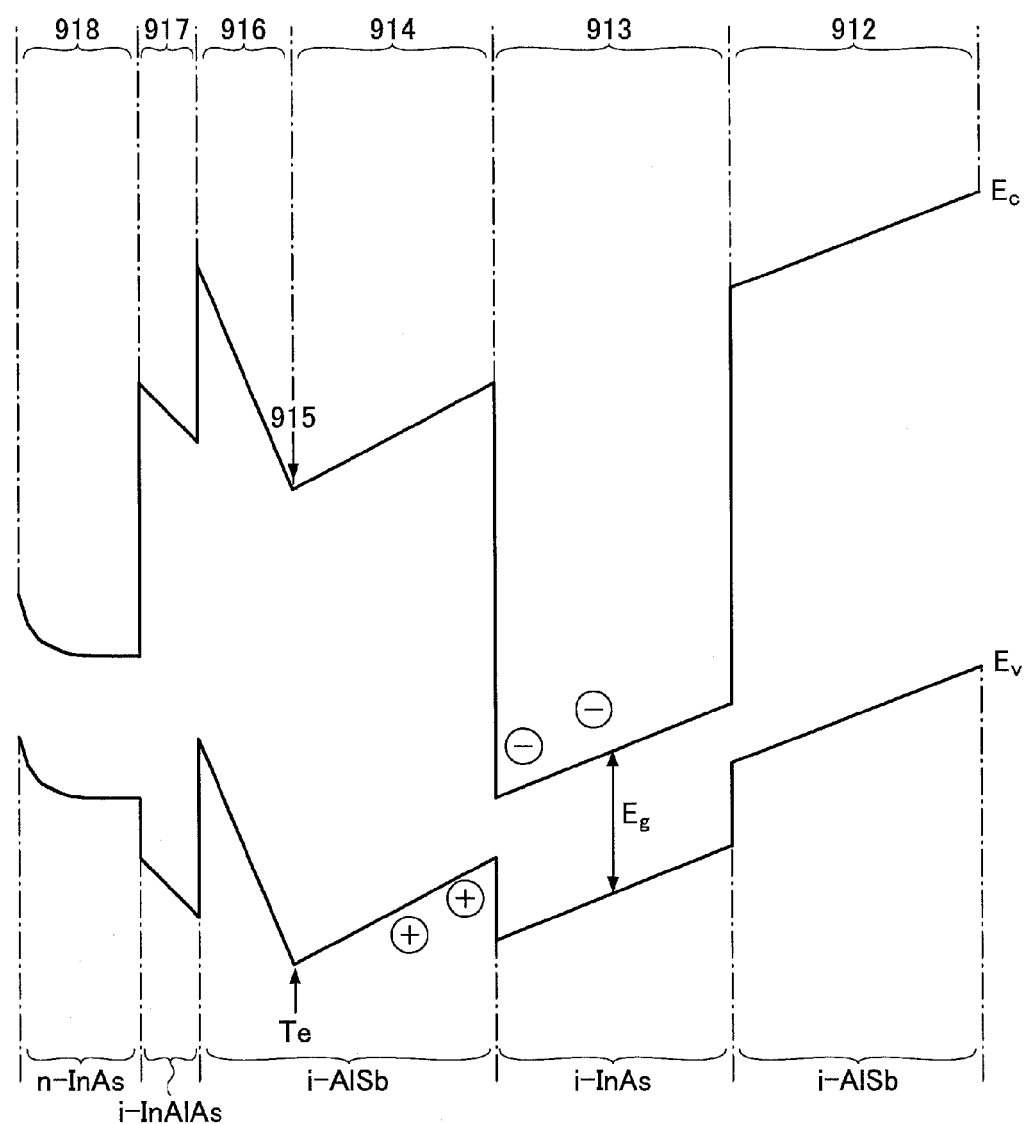
FIG. 4 is a second band diagram of an AlSb/InAs HEMT.
Figure 5:
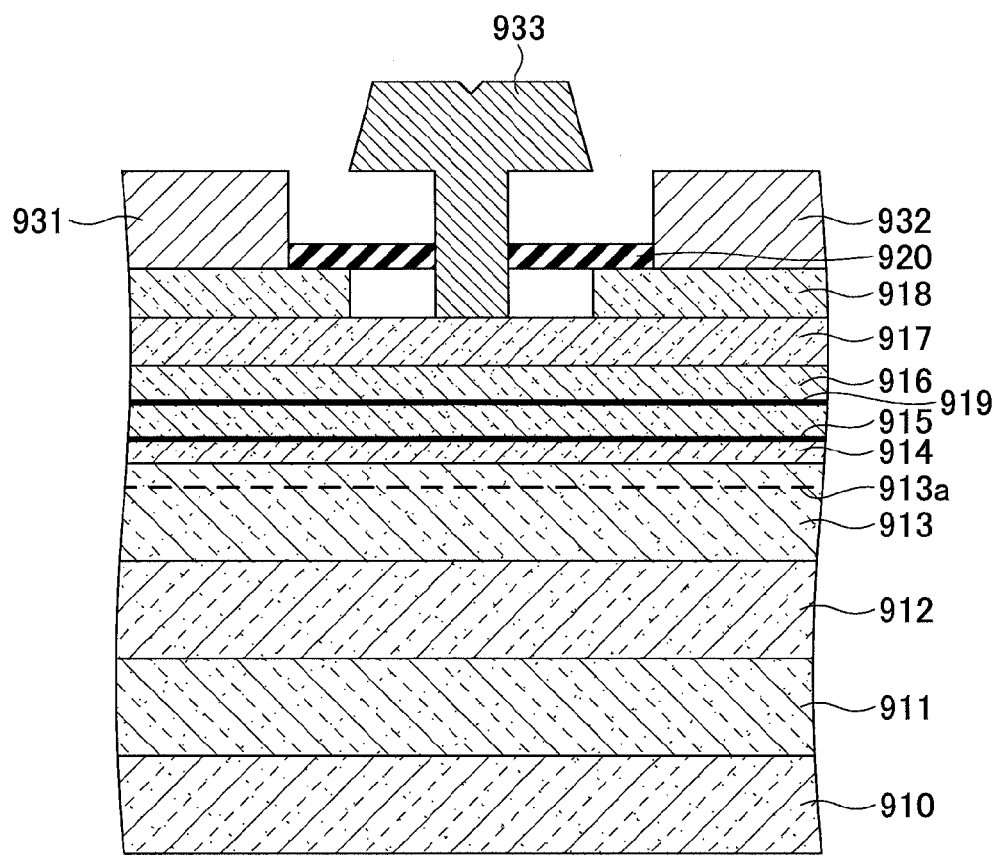
FIG. 5 is a third structure diagram of an AlSb/InAs HEMT.
Figure 6:
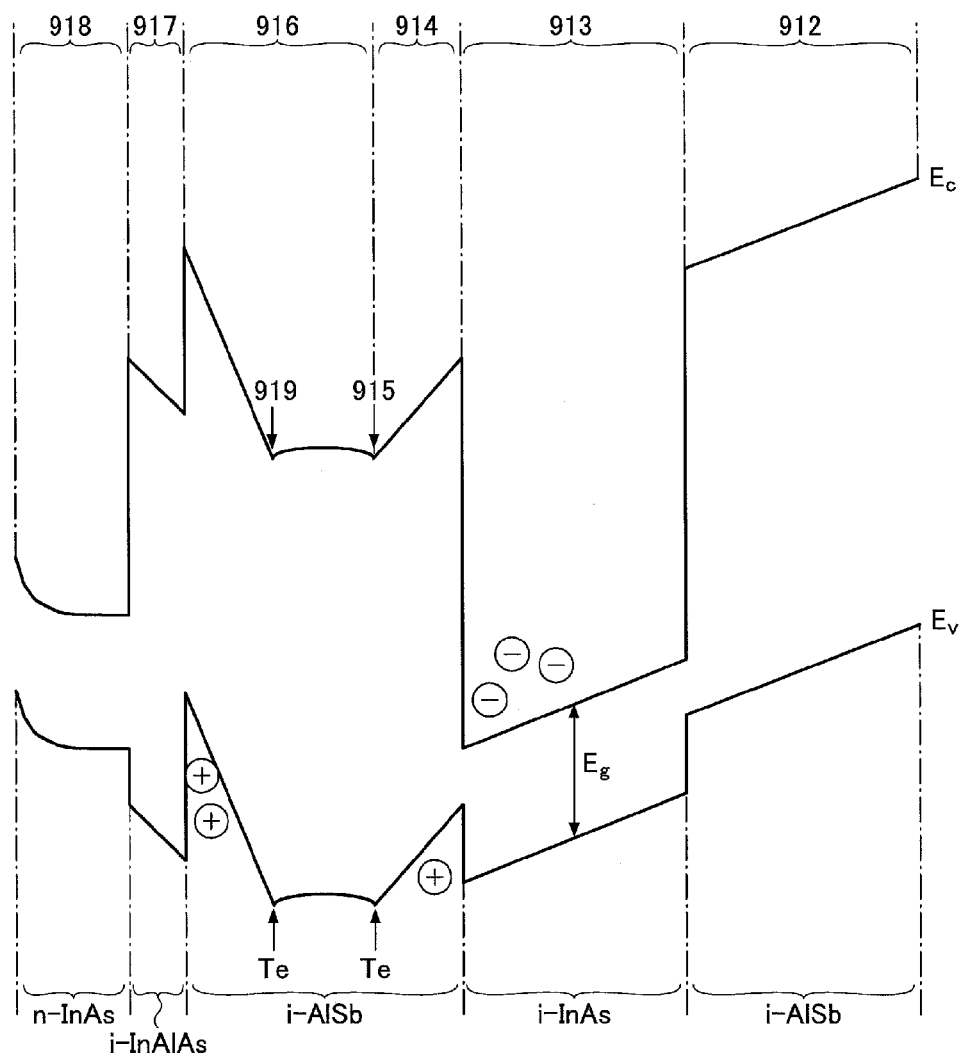
FIG. 6 is a third band diagram of an AlSb/InAs HEMT.

Suppose that in the HEMT illustrated in FIG. 1, the thickness of the i-AlSb spacer layer 914 is 3 nm, the thickness of the i-AlSb electron barrier layer 916 is 12 nm, and the Te-δ doping area 915 is formed at a position 3 nm away from the i-InAs channel layer 913. In this case, about 85% of holes exist on the side where the gate electrode 933 is provided (the surface side), and about 15% exist on the side where the i-InAs channel layer 913 is provided. Also, suppose that the thickness of the i-AlSb spacer layer 914 is 2 nm, the thickness of the i-AlSb electron barrier layer 916 is 8 nm, and the Te-δ doping area 915 is formed at a position 2 nm away from the i-InAs channel layer 913. In this case, almost 100% of holes exist on the side where the gate electrode 933 is provided (the surface side). Thus, in the HEMT illustrated in FIG. 1, a greater part of generated holes exist on the side where the gate electrode 933 is provided. Therefore, it is required to provide the i-InAlAs hole barrier layer 917.

Next, in the HEMT illustrated in FIG. 7 according to the present embodiment, suppose that the thickness of the n-AlSb layer 15 is 12 nm, the thickness of the i-AlSb barrier layer 17 is 3 nm, and the Te-δ doping area 16 is formed at a position 3 nm away from the surface and the like. In this case, the n-AlSb layer 15 is doped with Te, which makes about 15% of holes exist on the side where the gate electrode 33 is provided (the surface side), and about 85% exist on the side where the i-InAs channel layer 13 is provided. Also, suppose that the thickness of the n-AlSb layer 15 is 8 nm, the thickness of the i-AlSb barrier layer 17 is 2 nm, and the Te-δ doping area 16 is formed at a position 2 nm away from the surface and the like. In this case, the n-AlSb layer 15 is doped with Te, which makes almost 100% of holes exist on the side where the i-InAs channel layer 13 is provided. Thus, according to the present embodiment, a greater part of generated holes exist on the side where the i-InAs channel layer 13 is provided, hence it is not required to provide a barrier layer for holes. Therefore, it is possible to make the total thickness of barrier layers thinner.

A cutoff frequency $f_T$ of the HEMT which is a semiconductor device according to the present embodiment, will be described. The cutoff frequency $f_T$ is represented by the following Formula 1.

$$f_T = \frac{1}{2\pi(\tau_{transit} + \tau_{cc} + \tau_p)}$$ [Formula 1]

Here, $\tau_{transit}$ represents a transition time of electrons immediately under the gate, $\tau_{cc}$ represents a channel charging time, and $\tau_p$ represents a parasitic delay time. Here, $\tau_{transit}$ is represented by the following Formula 2 including a gate length $L_g$, an amount of compensation $\Delta L$ for an effective gate length caused by a spread of the depletion layer, and the average velocity of electrons v.

$$\tau_{transit} = (L_g + \Delta L)/v$$ [Formula 2]

Here, as represented by the following Formula 3, the average velocity of electrons v varies in inverse proportion to effective mass m*.

$$v \propto \frac{1}{m^*}$$ [Formula 3]

Consequently, for $In_{0.7}Ga_{0.3}As$ ($In_{0.7}Ga_{0.3}As$ channel), if an electron transit layer is InAs (InAs channel), the ratio of the electron transition time $\tau_{transit,\,InAs}$ to the electron transition time $\tau_{transit,\,In0.7Ga0.3As}$ is represented by the following Formula 4.

$$\frac{\tau_{transit,InAs}}{\tau_{transit,In_{0.7}Ga_{0.3}As}} = \frac{(L_g + \Delta L)_{InAs}/v_{InAs}}{(L_g + \Delta L)_{In_{0.7}Ga_{0.3}As}/v_{In_{0.7}Ga_{0.3}As}}$$ [Formula 4]

$$= \frac{(L_g + \Delta L)_{InAs} m^*_{InAs}}{(L_g + \Delta L)_{In_{0.7}Ga_{0.3}As} m^*_{In_{0.7}Ga_{0.3}As}}$$

Here, for an $In_{0.7}Ga_{0.3}As$ channel with the 1.0 gate length $L_g$ of 30 nm, it is reported that the cutoff frequency $f_T$ is 547 GHz, and also a delay time analysis shows $\tau_{transit}$ of 0.22 ps, $\tau_{cc}$ of 0.05 ps, and $\tau_p$ of 0.03 ps for the HEMT with this structure (K. Shinohara et al., DRC2003, p. 145). On the other hand, if $\Delta L$ is set to 20 nm, for an InAs channel with the gate length $L_g$ of 30 nm, the electron transition time $\tau_{transit}$ is represented by the following Formula 5.

$$\tau_{transit} = 0.22 \times (0.022/0.036) = 0.135 \text{ ps}$$ [Formula 5]

With $\tau_{cc}$ of 0.05 ps and $\tau_p$ of 0.03 ps, for the InAs channel, it is inferred that the cutoff frequency $f_T$ is 740 GHz. Thus, it is possible for the InAs channel to set the cutoff frequency $f_T$ higher, compared with the $In_{0.7}Ga_{0.3}As$ channel. Further, by setting the gate length to half ($L_g$=15 nm), the electron transition time $\tau_{transit}$ is represented by the following Formula 6.

$$\tau_{transit} = 0.135 \times (15+20)/(30+20) = 0.095 \text{ ps}$$ [Formula 6]

Here, assuming that a channel charging time $\tau_{cc}$ is proportionate to an effective gate length, with $\tau_{cc}$ of 0.035 ps and $\tau_p$ of 0.03 ps (and parasitic resistance is fixed), it is inferred that the cutoff frequency $f_T$ is 995 GHz. Consequently, it is possible to set the cutoff frequency $f_T$ further higher.

As described above, in the semiconductor device according to the present embodiment, by forming the Te-δ doping area 16 and the n-AlSb layer 15, barriers for electrons and holes are formed in the i-AlSb spacer layer 14 and the n-AlSb layer 15. Therefore, without providing an i-InAlAs layer or the like, holes can be confined into this area, which makes it possible to suppress a leak of holes to the gate electrode 33. Consequently, it is possible to make the total thickness of barrier layers thinner without reducing the density of electrons forming the 2DEG. Also, it is possible to maintain a high value of the channel aspect ratio $L_g/d$ even if the gate length $L_g$ is reduced because barrier layers can be made thinner. Consequently, it is possible to improve characteristic by reducing the gate length $L_g$.

Here, the above case is described in which AlSb is used for a material to form barrier layers such as the i-AlSb spacer layer 14, the n-AlSb layer 15, the Te-δ doping sheet 16, and the i-AlSb barrier layer 17, and InAs is used for an electron transit layer, or the i-InAs channel layer 13. However, materials are not restricted to this combination, but it may be a combination of AlGaSb used for barrier layers and InAs used for an electron transit layer. Also, it may be a combination of AlGaSb used for barrier layers and InGaAs used for an electron transit layer, or the like.

Also, although the above case is described in which InAs is used for a cap layer, or the n-InAs cap layer 18, other materials may be used to form a cap layer, including InGaAs, GaSb or the like.

(Manufacture Method of Semiconductor Device)

Next, a manufacture method of a semiconductor device will be described according to the present embodiment.

Figure 9A:
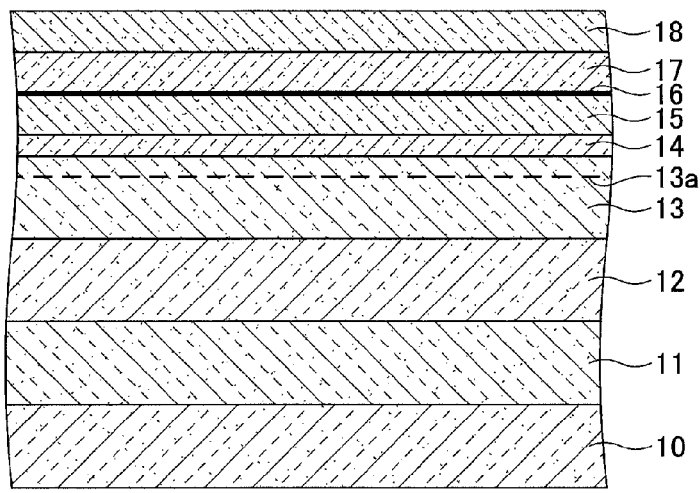
FIGS. 9A-9B are first process charts of a manufacture method of a semiconductor device according to the first embodiment.

First, as illustrated in FIG. 9A, semiconductor layers are formed above a GaAs substrate 10 by epitaxial growth using MBE (Molecular Beam Epitaxy). Specifically, above the GaAs substrate 10, a buffer layer 11, an i-AlSb barrier layer 12, an i-InAs channel layer 13, an i-AlSb spacer layer 14, an n-AlSb layer 15, a Te-δ doping area 16, an i-AlSb barrier layer 17, and an n-InAs cap layer 18 are formed.

The GaAs substrate 10 is a semi-insulating substrate. The thickness of the buffer layer 11 is about 1000 nm. Here, instead of the GaAs substrate 10, it is possible to use a semi-insulating InP substrate, GaSb substrate, Si substrate or the like. In this case, a material to form the buffer layer 11 differs depending on a material forming the substrate.

The i-AlSb barrier layer 12 has the thickness of about 50 nm, the i-InAs channel layer 13 has the thickness of about 10 nm, and the i-AlSb spacer layer 14 has the thickness of about 5 nm. The n-AlSb layer 15 has the thickness of about 10 nm, which is doped with Te as an impurity by about $1 \times 10^{19}$ cm$^{-3}$. Also, a sheet-shaped region in the Te-δ doping area 16 is doped with Te, and the doping amount of Te in this region is about $5 \times 10^{12}$ cm$^{-2}$. The i-AlSb barrier layer 17 has the thickness of about 5 nm. The n-InAs cap layer 18 has the thickness of about 5 nm, which is doped with Si as an impurity by about $5 \times 10^{18}$ cm$^{-3}$.

Figure 9B:
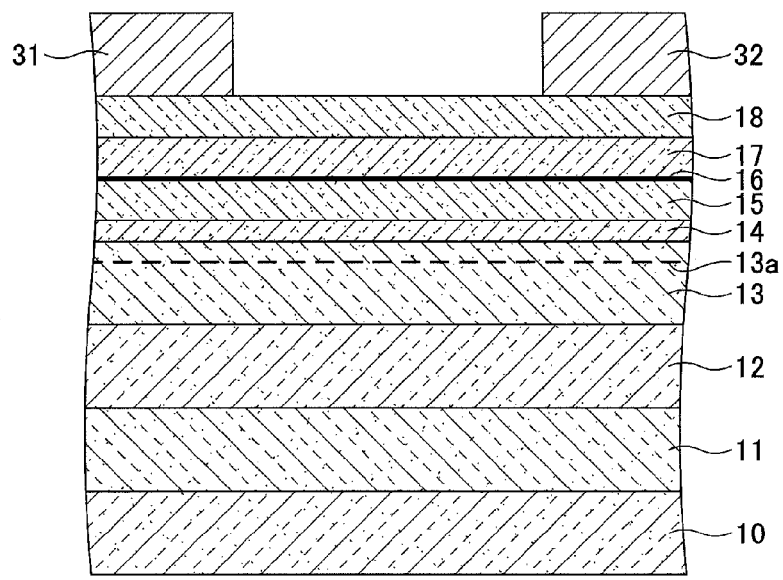

Next, as illustrated in FIG. 9B, on the n-InAs cap layer 18, a source electrode 31 and a drain electrode 32 are formed. Specifically, first, an element separating area (not illustrated) is formed by RIE (Reactive Ion Etching) using Cl$_2$/Ar gas mixture. After that, photoresist is applied on the n-InAs cap layer 18 to be exposed by a lithography machine and to be developed, which forms a resist pattern that has openings in areas where the source electrode 31 and the drain electrode 32 are to be formed. After that, a multilayer metal film made of Pd/Pt/Au is formed by evaporation in a vacuum or the like, which is immersed into an organic solvent or the like to remove the multilayer metal film formed on the resist pattern by a liftoff along with the resist pattern. After that, thermal annealing is applied in H$_2$/Ar ambient for ohmic contact to form the source electrode 31 and the drain electrode 32.

Figure 10A:
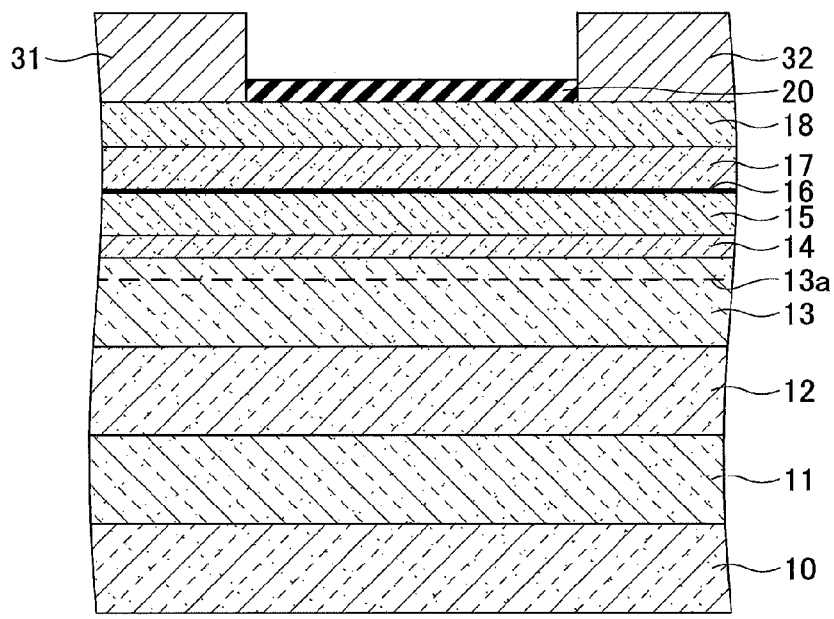
FIGS. 10A-10B are second process charts of a manufacture method of the semiconductor device according to the first embodiment.

Next, as illustrated in FIG. 10A, a silicon dioxide film 20 is formed in an area between the source electrode 31 and the drain electrode 32 on the n-InAs cap layer 18 by plazma CVD (Chemical Vapor Deposition). The thickness of the formed silicon dioxide film 20 is about 20 nm.

Figure 10B:
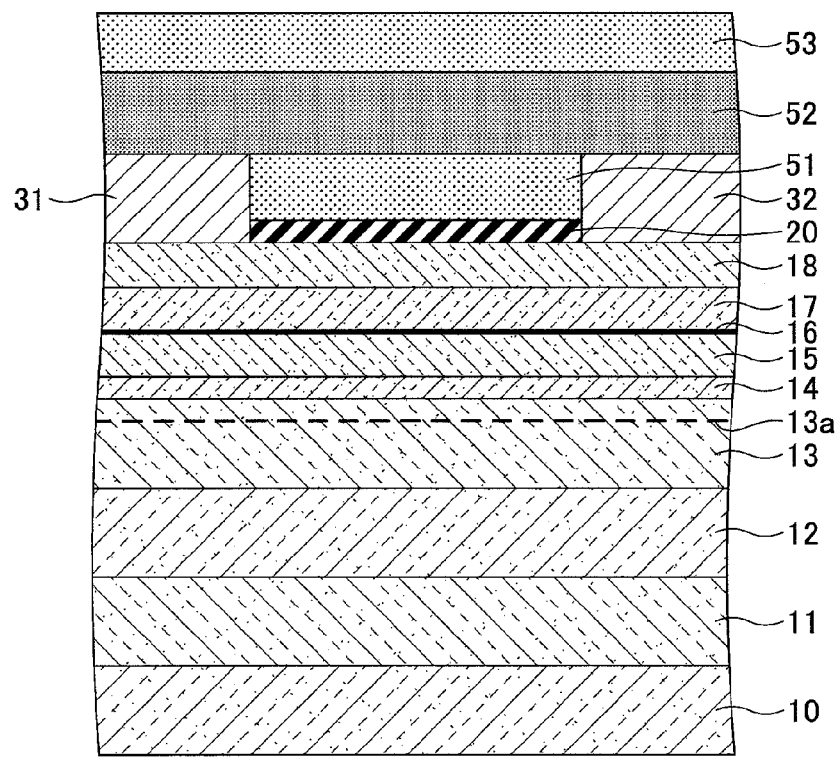

Next, as illustrated in FIG. 10B, on the silicon dioxide film 20, the source electrode 31 and the drain electrode 32, a first resist layer 51, a second resist layer 52, a third resist layer 53 are applied in this order to be laminated. The first resist layer is formed by ZEP resist (made by Zeon Corporation), the second resist layer 52 is formed by PMGI (Poly-dimethylglutarimide), and the third resist layer 53 is formed by ZEP resist.

Next, as illustrated in FIG. 11A, by executing the first exposure by an EB (electron beam) lithography machine and development, an opening area 53a is formed in the third resist layer 53, and further, an opening area 52a is formed in the second resist layer 52. Although the opening areas 52a and 53a are formed by a single exposure, the opening area 52a in the second resist layer 52 can be formed wider than the opening area 53a in the third resist layer 53 because the second resist layer 52 and the third resist layer 53 have different exposure sensitivities. Here, different developers are used for a developer used to form the opening area 53a in the third resist layer 53, and a developer used to form the opening area 52a in the second resist layer 52.

Next, as illustrated in FIG. 11B, by executing the second exposure by the EB lithography machine and development, an opening area 51a is formed in the first resist layer 51. The opening area 51 is formed so that the size of the formed opening area 51a makes the gate electrode 33 be formed with a desired gate length. Therefore, the opening area 51a is formed narrower than the opening area 53a and the like.

Next, as illustrated in FIG. 12A, an opening area 20a is formed in the silicon dioxide film 20 using the first resist layer 51 as a mask. Specifically, by removing the silicon dioxide film 20 by RIE in the area where the first resist layer is not formed, the opening area 20a is formed. CF$_4$ or the like is used as etching gas for the RIE.

Next, as illustrated in FIG. 12B, an opening area 18a is formed for electrical separation in the n-InAs cap layer 18. Specifically, by removing the n-InAs cap layer 18 with wet etching from the opening area 20a in the silicon dioxide film 20, an opening area 18a is formed to expose the i-AlSb barrier layer 17 in this area. For the wet etching, a solution mixture of citric acid (C$_6$B$_3$O$_7$), ammonia (NH$_3$), and hydrogen peroxide (H$_2$O$_2$), or the like may be used as an etching solution.

Next, as illustrated in FIG. 13A, a multilayer metal film 33a consisting of Ti/Pt/Au is formed by evaporation in a vacuum or the like on exposed surfaces of the first resist layer 51, the third resist layer 53 and the i-AlSb barrier layer 17.

Next, as illustrated in FIG. 13B, by immersing into an organic solvent or the like, the multilayer metal film 33a formed on the third resist layer 53 is removed by a liftoff along with the third resist layer 53. At this time, the first resist layer 51 and the second resist layer 52 are also removed. Thus, a T-shaped gate electrode 33 can be formed on the i-AlSb barrier layer 17.

With the above processes, the semiconductor device can be produced according to the present embodiment.

Second Embodiment

Figure 14:
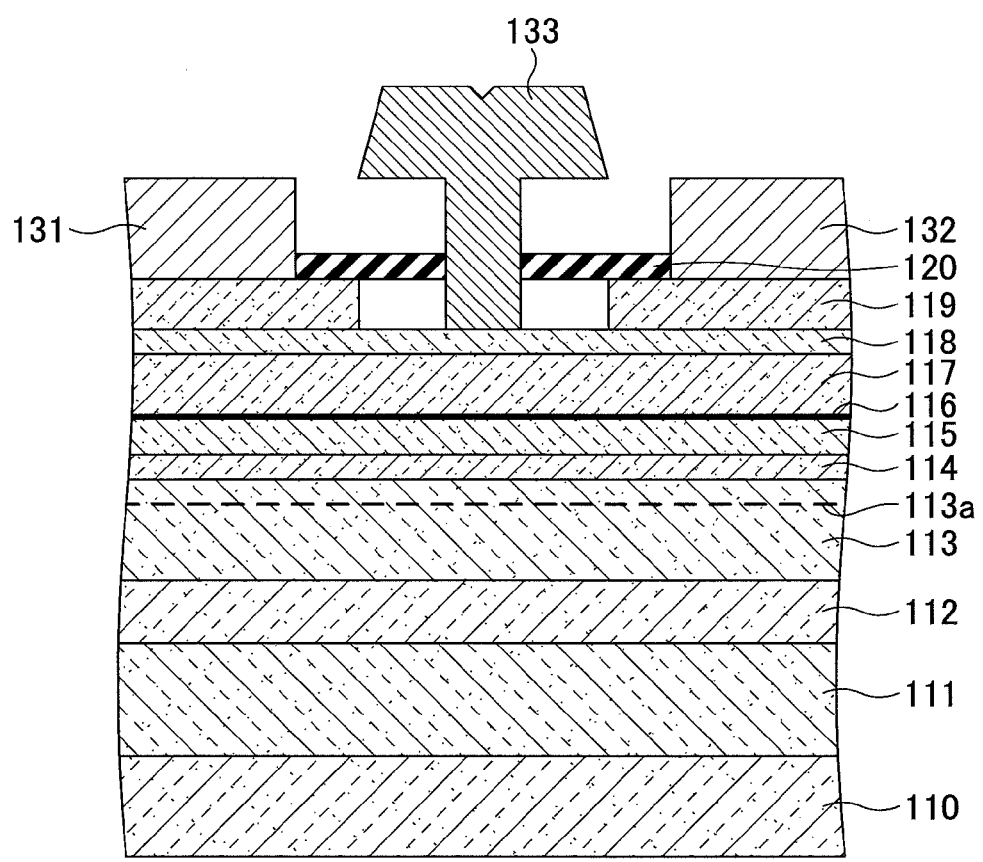
FIG. 14 is a structure diagram of a semiconductor device according to a second embodiment.

Next, a semiconductor device will be described according to the second embodiment. According to the present embodiment, a HEMT has a structure in which an electron transit layer is formed with Si, and a barrier layer is formed with SiGe. With reference to FIG. 14, the semiconductor device according to the present embodiment will be described.

The HEMT has a high resistance Si substrate 110, above which graded layers are formed with a buffer layer 111, an i-SiGe buffer layer 112, an i-Si channel layer 113, an i-SiGe spacer layer 114, an n-SiGe layer 115, a P-δ doping area 116, an i-SiGe barrier layer 117, an i-Si layer 118, and an n-Si cap layer 119. On the n-Si cap layer 119, a source electrode 131 and a drain electrode 132 are formed, and a gate electrode 133 is formed on the i-Si layer 118. Also, except for the area where the gate electrode 133 is formed, a silicon dioxide film 120 is formed in an area between the source electrode 131 and the drain electrode 132 above the n-Si cap layer 119 or the like. Here, in the HEMT with this structure, the i-Si layer 113 is an electron transit layer. Consequently, two dimensional electron gas (2DEG) 113a is formed in the i-Si channel layer 113.

The buffer layer 111 is formed with about a 2 μm-thick i-Si$_{1-x}$Ge$_x$ graded layer where the value of x is varied from 0 to 0.3. The i-SiGe buffer layer 112 is formed with i-Si$_{0.7}$Ge$_{0.3}$, whose thickness is about 1 μm.

The i-Si channel layer 113 is formed with the thickness of about 10 nm, and the i-SiGe spacer layer 114 is formed with i-Si$_{0.7}$Ge$_{0.3}$ that has the thickness of about 3 nm.

The n-SiGe layer 115 is formed with n-Si$_{0.7}$Ge$_{0.3}$ that has the thickness of about 5 nm and is doped with P (phosphorus) as an impurity by about $4 \times 10^{18}$ cm$^{-3}$. Also, the P-δ doping area 116 is formed as a sheet-shaped region where the doping amount of P is about $5 \times 10^{12}$ cm$^{-2}$.

The i-SiGe barrier layer 117 is formed with n-Si$_{0.7}$Ge$_{0.3}$ that has the thickness of about 7 nm and the i-Si layer 118 is formed with the thickness of about 3 nm. The n-Si cap layer 119 is formed with the thickness of about 15 nm and is doped with P as an impurity by about $4 \times 10^{19}$ cm$^{-3}$.

With the semiconductor device according to the present embodiment, substantially the same effects can be obtained as with the semiconductor device according to the first embodiment, although electrical characteristics are different due to different semiconductor materials. Contents other than the above are the same as in the first embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   an electron transit layer formed with a semiconductor material, the electron transit layer being formed on a semiconductor substrate;
   an n-type semiconductor layer formed with a semiconductor material having a wider bandgap than the electron transit layer, the n-type semiconductor layer being formed on the electron transit layer;
   a δ doping area having an n-type impurity doped in a sheet-shaped region, the δ doping area being formed on the n-type semiconductor layer; and
   a barrier layer formed with a semiconductor material having a wider bandgap than the electron transit layer, the barrier layer being formed on the δ doping area.

2. The semiconductor device as claimed in claim 1, in which the electron transit layer is formed with a material including InAs, and the n-type semiconductor layer and the barrier layer are formed with a material including AlSb.

3. The semiconductor device as claimed in claim 1, in which the electron transit layer is formed with a material including InAs, and the n-type semiconductor layer and the barrier layer are formed with a material including AlGaSb.

4. The semiconductor device as claimed in claim 1, in which the electron transit layer is formed with a material including InGaAs, and the n-type semiconductor layer and the barrier layer are formed with a material including GaAsSb.

5. The semiconductor device as claimed in claim 1, in which the electron transit layer, the n-type semiconductor layer, the δ doping area and the barrier layer are formed by MBE.

6. The semiconductor device as claimed in claim 1, in which a spacer layer formed with the same semiconductor material as with the barrier layer is provided between the electron transit layer and the n-type semiconductor layer.

7. The semiconductor device as claimed in claim 1, in which the n-type semiconductor layer is formed with a semiconductor material for forming the barrier layer, the semiconductor material being additionally doped with an n-type impurity.

8. The semiconductor device as claimed in claim 1, in which the impurity doped into the n-type semiconductor and the impurity doped into the sheet-shaped region in the δ doping area are the same element.

9. The semiconductor device as claimed in claim 1, in which the impurity doped into the n-type semiconductor is Te.

10. The semiconductor device as claimed in claim 1, in which the impurity doped into the sheet-shaped region in the δ doping area is Te.

11. The semiconductor device as claimed in claim 1, in which the barrier layer is an upper barrier layer, and a lower barrier layer is formed with a semiconductor material having a wider bandgap than the electron transit layer.

12. The semiconductor device as claimed in claim 11, in which the lower barrier layer is formed with a semiconductor material including the same semiconductor material as included in the upper barrier layer.

13. The semiconductor device as claimed in claim 1, in which a cap layer is formed on the barrier layer, the cap layer being formed with a semiconductor material having a narrower bandgap than the barrier layer, and the semiconductor material being doped with an n-type impurity.

14. The semiconductor device as claimed in claim 13, in which the cap layer is formed with a material including either one of InAs, InGaAs, and GaSb.

15. The semiconductor device as claimed in claim 13, in which the cap layer is formed with a semiconductor material forming the electron transit layer, the semiconductor material being additionally doped with an n-type impurity.

16. The semiconductor device as claimed in claim 13, in which the impurity doped into the cap layer is Si.

17. The semiconductor device as claimed in claim 13, in which a source electrode and a drain electrode are formed on the cap layer, and a gate electrode is formed on the barrier layer.

18. The semiconductor device as claimed in claim 1, in which the electron transit layer is formed with a material including Si, and the n-type semiconductor layer and the barrier layer are formed with a material including SiGe.

* * * * *